(12) United States Patent
Kirkpatrick et al.

(10) Patent No.: US 12,538,737 B2
(45) Date of Patent: Jan. 27, 2026

(54) INTEGRATED WET CLEAN FOR EPITAXIAL GROWTH

(71) Applicant: Applied Materials, Inc., Santa Clara, CA (US)

(72) Inventors: Brian K. Kirkpatrick, Allen, TX (US); Uday Mitra, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 142 days.

(21) Appl. No.: 17/859,752

(22) Filed: Jul. 7, 2022

(65) Prior Publication Data

US 2023/0008695 A1 Jan. 12, 2023

Related U.S. Application Data

(60) Provisional application No. 63/218,994, filed on Jul. 7, 2021.

(51) Int. Cl.
*H01L 21/67* (2006.01)
*B08B 3/08* (2006.01)
(Continued)

(52) U.S. Cl.
CPC .......... *H01L 21/67184* (2013.01); *B08B 3/08* (2013.01); *B08B 13/00* (2013.01);
(Continued)

(58) Field of Classification Search
CPC ......... H01L 21/67184; H01L 21/67201; H01L 21/67051; H01L 21/67069;
(Continued)

(56) References Cited

U.S. PATENT DOCUMENTS 6,035,871 A  3/2000  Eui-yeol
6,074,443 A * 6/2000  Venkatesh ......... H01L 21/67276
                                                    29/25.01
(Continued)

FOREIGN PATENT DOCUMENTS

JP  10261687 A  9/1998
JP  2004119628 A  4/2004
(Continued)

*Primary Examiner* — Rudy Zervigon
(74) *Attorney, Agent, or Firm* — Kilpatrick Townsend & Stockton LLP

(57) ABSTRACT

Exemplary integrated cluster tools may include a factory interface including a first transfer robot. The tools may include a wet clean system coupled with the factory interface at a first side of the wet clean system. The tools may include a load lock chamber coupled with the wet clean system at a second side of the wet clean system opposite the first side of the wet clean system. The tools may include a first transfer chamber coupled with the load lock chamber. The first transfer chamber may include a second transfer robot. The tools may include a dry etch chamber coupled with the first transfer chamber. The tools may include a second transfer chamber coupled with the first transfer chamber. The second transfer chamber may include a third transfer robot. The tools may include a process chamber coupled with the second transfer chamber.

6 Claims, 3 Drawing Sheets

(51) Int. Cl.
*B08B 13/00* (2006.01)
*C30B 25/02* (2006.01)
*C30B 35/00* (2006.01)

(52) U.S. Cl.
CPC .............. *C30B 25/02* (2013.01); *C30B 35/005* (2013.01); *H01L 21/67201* (2013.01); *H01L 21/67051* (2013.01); *H01L 21/67069* (2013.01); *H01L 21/67207* (2013.01)

(58) Field of Classification Search
CPC ......... H01L 21/67207; H01L 21/67057; H01L 21/67161; H01L 21/6719; H01L 21/67196; H01L 21/67173; H01L 21/6776; H01L 21/67155; H01L 21/67017; H01L 21/67748; H01L 21/67751; H01L 21/67745; B08B 3/08; B08B 13/00; C30B 25/02; C30B 35/005; C23C 16/54; C23C 16/45551; C23C 16/545; C23C 16/4412; C23C 14/568; C23C 16/4401
USPC ................. 118/719; 156/345.31, 345.32
See application file for complete search history.

(56) References Cited

U.S. PATENT DOCUMENTS

| | | | | |
|---|---|---|---|---|
| 6,328,815 | B1* | 12/2001 | Jeng ................. | H01L 21/67745 |
| | | | | 134/32 |
| 6,519,498 | B1* | 2/2003 | Jevtic ............... | G05B 19/41865 |
| | | | | 700/100 |
| 9,147,592 | B2* | 9/2015 | Englhardt ......... | H01L 21/67739 |
| 2004/0007325 | A1* | 1/2004 | Pan .................. | H01L 21/67167 |
| | | | | 156/345.1 |
| 2015/0255270 | A1 | 9/2015 | Ku et al. | |
| 2017/0290166 | A1 | 10/2017 | Rice et al. | |
| 2020/0203481 | A1 | 6/2020 | Thareja et al. | |

FOREIGN PATENT DOCUMENTS

| | | |
|---|---|---|
| JP | 2009525611 A | 7/2009 |
| JP | 2009543355 A | 12/2009 |
| JP | 2019061996 A | 4/2019 |
| JP | 2019080026 A | 5/2019 |

* cited by examiner

INTEGRATED WET CLEAN FOR EPITAXIAL GROWTH

CROSS-REFERENCE TO RELATED APPLICATIONS

This application claims the benefit of U.S. Provisional Application 63/218,994, filed Jul. 7, 2021, which is incorporated here by reference.

TECHNICAL FIELD

The present technology relates to semiconductor processing and materials. More specifically, the present technology relates to cluster tool configurations and methods performed on cluster tools.

BACKGROUND

Epitaxial film growth generally seeks a pristine interfacial surface on which the growth is to occur. Cleaning processes may include wet cleaning, dry cleaning, and thermal baking operations to provide a sufficiently clean surface. However, as increased processing is performed with reduced thermal budgets, thermal baking may not be feasible.

Thus, there is a need for improved systems and methods that can be used to produce high quality devices and structures. These and other needs are addressed by the present technology.

SUMMARY

Exemplary integrated cluster tools may include a factory interface including a first transfer robot. The tools may include a wet clean system coupled with the factory interface at a first side of the wet clean system. The tools may include a load lock chamber coupled with the wet clean system at a second side of the wet clean system opposite the first side of the wet clean system. The tools may include a first transfer chamber coupled with the load lock chamber. The first transfer chamber may include a second transfer robot. The tools may include a dry etch chamber coupled with the first transfer chamber. The tools may include a second transfer chamber coupled with the first transfer chamber. The second transfer chamber may include a third transfer robot. The tools may include a process chamber coupled with the second transfer chamber.

In some embodiments, the wet clean system may include a single-wafer wet clean chamber operably maintained at atmospheric pressure. The first transfer chamber may be maintained at vacuum conditions. The single-wafer wet clean chamber may be fluidly coupled with multiple chemistry delivery systems. The single-wafer wet clean chamber may be accessible to the first transfer robot of the factory interface. The wet clean system may include a fourth transfer robot disposed in the wet clean system. The fourth transfer robot may be operable to transfer substrates between the single-wafer wet clean chamber and the load lock chamber. The wet clean system may include a plurality of single-wafer wet clean chambers stacked on one another. Each single-wafer wet clean chamber may be fluidly coupled with multiple chemistry delivery systems. A track on which the first transfer robot operates may extend into the wet clean system.

Some embodiments of the present technology may encompass integrated cluster tools. The tools may include a factory interface including a first transfer robot. The factory interface may include one or more access locations for front-opening unified pods on a first surface of the factory interface. The tools may include a wet clean system coupled at a first side of the wet clean system with a second surface of the factory interface opposite the first surface of the factory interface. The tools may include a load lock chamber coupled with the wet clean system at a second side of the wet clean system opposite the first side of the wet clean system. The tools may include a transfer chamber coupled with the load lock chamber. The transfer chamber may include a second transfer robot. The tools may include an epitaxial growth chamber coupled with the transfer chamber.

In some embodiments, the transfer chamber may be a second transfer chamber. The integrated cluster tool may include a first transfer chamber coupled between the load lock chamber and the second transfer chamber. The tools may include a dry etch chamber coupled with the first transfer chamber. The wet clean system may include a single-wafer wet clean chamber operably maintained at atmospheric pressure. The transfer chamber may be maintained at vacuum conditions. The single-wafer wet clean chamber may be accessible to the first transfer robot of the factory interface. The wet clean system may include a fourth transfer robot disposed in the wet clean system. The fourth transfer robot may be operable to transfer substrates between the single-wafer wet clean chamber and the load lock chamber. The wet clean system may include two or more vertically stacked, single-wafer wet clean chambers. Each single-wafer wet clean chamber may be fluidly coupled with a different chemistry delivery system.

Some embodiments of the present technology may encompass methods of processing a substrate. The methods may include receiving the substrate in a factory interface of an integrated cluster tool. The methods may include delivering the substrate from the factory interface to a wet clean system coupled with the factory interface on a first surface of the wet clean system. The methods may include processing the substrate in a wet clean chamber of the wet clean system. The methods may include delivering the substrate from the wet clean system to a load lock chamber coupled with the wet clean system on a second surface of the wet clean system opposite the first surface of the wet clean system. The methods may include delivering the substrate from the load lock chamber to an epitaxial growth chamber. The methods may include epitaxially growing material on the substrate.

In some embodiments, the substrate may be delivered from the wet clean system to the epitaxial growth chamber in less than 10 minutes. Processing the substrate in the wet clean chamber may include cleaning the substrate with a first chemistry including hydrofluoric acid. Processing the substrate in the wet clean chamber may include cleaning the substrate with a second chemistry comprising ammonium hydroxide. Processing the substrate in the wet clean chamber may include cleaning the substrate with a third chemistry comprising hydrochloric acid. The methods may include, prior to delivering the substrate to the epitaxial growth chamber, performing a dry etch process on the substrate.

Such technology may provide numerous benefits over conventional systems and techniques. For example, the present technology may provide improved surface conditions to support epitaxial growth. Additionally, the present technology may increase uniformity wafer-to-wafer by reducing total time between cleaning and epitaxial growth operations, as well as variations in time between processing. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
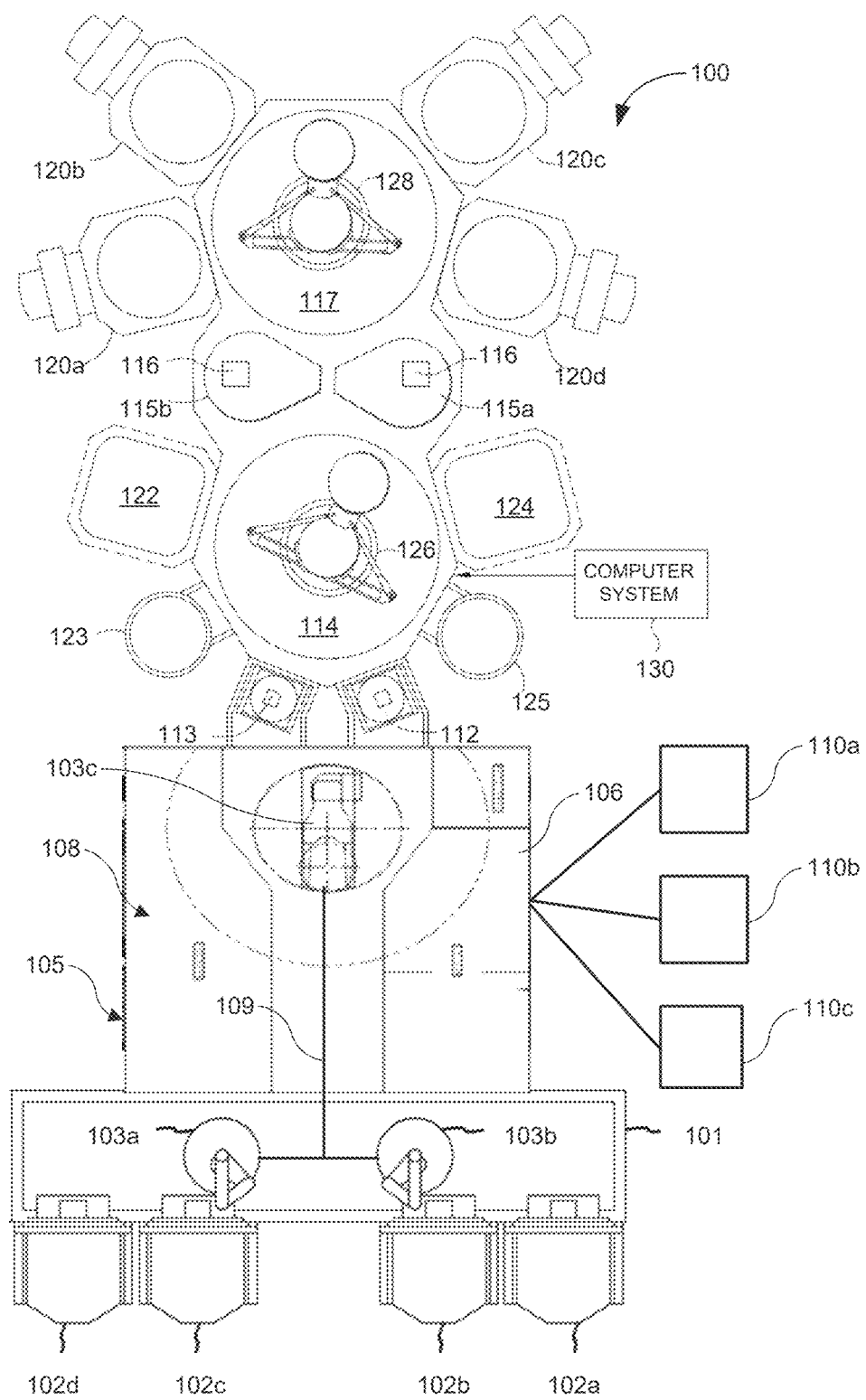
FIG. 1 shows a schematic top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Conventional epitaxial film deposition typically includes a hydrogen baking operation that may occur at greater than or about 700° C., greater than or about 800° C., greater than or about 1000° C., or more. As epitaxial growth is extended to different device structures, and may be used for selective deposition or growth on specific surfaces, high temperature anneals may not be feasible. At the same time, epitaxial film thicknesses are reducing for newer structures, which may increase the importance of interfacial layer quality. While the high temperatures may be used to facilitate the removal of residual oxygen and residual carbon, the process may also exceed thermal budgets of other exposed materials in the structure. The high temperature may cause reflow of surface atoms, and may impact doping profiles by relaxing strain in crystal structures and allowing more mobility of dopants that can cause clustering and reduce uniformity throughout the layer.

To produce sufficient surface conditions for epitaxial growth, removal of impurities, such as carbon, oxygen, chlorine, and fluorine, is performed. The conventional process may perform a wet cleaning prior to delivering substrates to an epitaxial processing tool. The delay in this process may leave substrates exposed to environmental conditions, even in a semiconductor processing facility, for hours at a time. Although a dry etch process may be performed prior to epitaxial growth, the time delay after the wet cleaning may cause significant increases in oxide development, and the amount of growth may vary widely wafer-to-wafer. Additionally, carbon and other impurities may begin to re-adsorb on the surface, which may lead to defects in epitaxial growth. Dry cleans may also have limited effectiveness in removing interfacial contaminant levels. Consequently, conventional technologies have struggled to remove a bake operation needed to remove these impurities.

The present technology may overcome these issues by utilizing a tool and process sequence that may limit exposure of wet-cleaned substrates. By incorporating the wet clean system on an epitaxial cluster tool, the delay between wet-cleaning and vacuum processing may be limited to minutes or seconds. Despite conventional technologies seeking to reduce time delay, delays of hours are inevitable in conventional technologies based on batch processing in which multiple substrate are processed at each tool before being transferred to a subsequent tool. Consequently, ex situ wet cleaning is incapable of producing structures and contaminant levels according to processing embodiments of the present technology. Although the remaining disclosure will routinely identify specific materials and processes utilizing the disclosed technology, it will be readily understood that the systems and methods are equally applicable to a variety of materials and processes as may occur during deposition or other semiconductor processing. Accordingly, the technology should not be considered to be so limited as for use with epitaxial growth alone. After discussing an exemplary chamber system that may be used according to some embodiments of the present technology, methods of semiconductor processing that may occur on the systems will be described.

FIG. 1 illustrates a schematic top plan view of an integrated cluster tool, or multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include components that may be maintained at atmospheric pressure, which may be any pressure within a processing facility, such as including positive or negative pressure environments. The system may also include components that are maintained under vacuum conditions, and which may be separated from the atmospheric components by a load lock system, for example.

Multi-chamber processing system 100 may include a factory interface 101, which may include receptacles along a first side of the unit to receive one or more front-opening unified pods, or FOUPs 102, for providing substrates to the system for processing. Although four FOUPs are illustrated as being coupled with the system, in some embodiments, one, two, three, four, or more FOUPs may be connected at any time. Each FOUP 102 may include one or more substrates for processing. Because FOUPs typically store several substrates for processing, conventional technologies often have large time delays between processing between tools. Each tool may process dozens of substrates as a batch, prior to transferring all substrates to the next tool. This may increase time delay, leading to the challenges described above.

Factory interface 101 may include one or more transfer robots 103, which may be operated to move laterally within the factory interface, and access any of the FOUPs. Opposite the side of the factory interface on which the FOUPs may be coupled may be a wet clean system 105, which may include one or more wet clean chambers 106. The wet clean system 105 may be coupled with the factory interface along a first side or surface of the wet clean system as shown, and may be accessible by one or more transfer robots 103. For example, in some embodiments, factory interface transfer robots 103a or 103b may be used to receive substrates from a FOUP connected to the factory interface, and may also be used to deliver substrates to the wet clean chamber 106. The factory interface transfer robots may also be used to deliver substrates to one or more load lock chambers 112, which may be coupled with the wet clean system 105 at a second side or surface of the wet clean system, such as the side opposite where the wet clean system is coupled with the factory interface 101.

In some embodiments, an additional transfer robot 103c may be included in the wet clean system, and may work with or in lieu of the factory interface transfer robots. For example, in some embodiments the factory interface transfer robot may deliver the substrate into the wet clean chamber 106, and the wet clean system transfer robot 103c may deliver the substrates from the wet clean chamber 106 to the load lock chambers 112. Additionally, the wet clean system transfer robot may receive substrates from the factory interface, and may deliver to and from the wet clean chamber 106. In some embodiments a track 109 on which the robots may be moved may extend through both the factory interface and the wet clean system to facilitate one or more robots being operable to receive and deliver substrates among the system components. Any of the noted transfer robots may move along any aspect of the track in some embodiments of the present technology.

Wet clean system 105 may include a number of components and chambers for processing substrates. For example, wet clean hardware 108 may be included in the system to facilitate operations as will be explained further below. Wet clean chamber 106 may be one or more chambers in embodiments of the present technology. For example, wet clean chamber 106 may include a batch cleaning bath or system, and may be or include one or more single-wafer wet clean chambers in some embodiments. Single-wafer wet clean chambers may be stacked in some embodiments, as will be explained below, which may allow individual processes to be performed in each chamber, or may allow multiple substrates to be processed simultaneously, for example. The chambers may be fluidly coupled with one or more chemistry delivery systems 110, which may include pumps, tubing, and other materials for delivering one or more process chemistries to the one or more wet clean chambers 106.

Any number of wet clean processes may be performed according to aspects of the present technology, and in some embodiments the wet cleaning may include multiple cleaning processes and chemistries. For example, in some embodiments a first chemistry delivery system 110a may provide a first chemistry including hydrofluoric acid. A second chemistry delivery system 110b may provide a second chemistry including ammonium hydroxide. A third chemistry delivery system 110c may provide a third chemistry including hydrochloric acid. It is to be understood that the chemistries may come from one or more fluid sources and be delivered to one or more wet clean chambers. Additionally, although shown separate from the wet clean system 105 for ease of explanation, it is to be understood that the fluid delivery systems may be included with the system, such as being part of the clean hardware section of the system, for example. Once cleaning operations have been performed, substrates may be delivered into load lock chambers 112, which may transfer the substrates to a vacuum environment for further processing. By limiting delay between wet cleaning and further processing, in some embodiments baking operations may be limited or avoided.

As explained above, wet clean chamber 106 may be maintained at atmospheric pressure, or a common pressure with the facilities environment. Multi-chamber processing system 100 may also include a number of components at vacuum conditions. For example, load lock chambers 112 may be used to transfer substrates to and from a vacuum environment coupled on the opposite sides of the load lock chambers from the wet clean system. Although single-wafer load locks are illustrated, it is to be understood that dual-wafer or multi-wafer load locks may also be used in systems according to embodiments of the present technology. Once substrates are delivered to the load lock chambers, vacuum conditions may be enacted, as well as one or more other process operations. Because wet cleaning as will be described further below may remove a number of contaminant materials, a controlled environment may then be employed for further processing. Along with providing vacuum pressures, load lock chambers 112 may perform additional operations, such as purging and heating. For example, load lock chambers 112 may be purged with nitrogen, argon, or some other inert or non-reactive gas, which may limit contaminant incorporation or oxide formation on the surface of the substrate. Additionally, a heating operation may be performed, which may ensure moisture is removed or prevented from contacting the substrate, while maintaining thermal budgets of the substrate. For example, the load lock chamber may heat the substrate to temperatures that are less than or about 400° C., less than or about 300° C., less than or about 200° C., less than or about 100° C., or less.

Once the substrate is ready for further processing, or the substrate is received in the queue, further processing within the system may occur. The multi-chamber processing system 100 may include transfer chambers for providing the substrate to any number of locations on the system. For example, a first transfer chamber 114 may be coupled with the load lock chambers 112 as illustrated, and may receive a substrate for further processing. About the first transfer chamber may be any number of processing chambers, which may be used to perform any number of processes on the substrate. Although the remaining discussion will involve chambers involved in preparation for, or performance of, epitaxial growth operations, it is to be understood that any number of other processing chambers may be included on the system. For example, chambers 123 and 125 may be used for pre-heating, metrology, orientation, or any number of other operations that may be performed in semiconductor processing. Substrates may then be delivered into processing chambers 122, 124, which may be configured to perform an etch process. Any number of etch processes may be performed, such as a process for removing native oxide, a process for etching silicon, or silicon-containing materials, or any other number of etch processes that may be performed to prepare a substrate for semiconductor processing. The etch processes may include plasma or non-plasma processes, and may be any number of dry etch processes according to embodiments of the present technology.

After dry etch processing, substrates may be transferred to additional processing chambers 120, which may be used to perform one or more epitaxial deposition operations as will be described further below. A second transfer chamber 117 may be coupled with first transfer chamber 114, and may be used to deliver substrates to and from the epitaxial growth chambers in some embodiments. As will be explained in further detail below, each of the processing chambers 120a, 120b, 120c, and 120d may be configured similarly or differently, depending on the processing to be performed.

For example, chambers may be configured to supply separate dopants or perform different growth operations, which may facilitate a number of epitaxial operations in some embodiments. Delivery between the first transfer chamber 114 and the second transfer chamber 117 may be facilitated with transfer robots within the chambers. Two substrate transfer platforms 115 may be disposed between transfer chamber 114 and transfer chamber 117, and may facilitate transfer between robots 126 and 128. The transfer platforms 115a and 115b may be open to the transfer chambers, which may also be buffer chambers, or the platforms may be selectively isolated or sealed from the chambers to allow different operational pressures to be maintained between the two transfer chambers, for example. Transfer platforms 115 may each include one or more tools 116, such as for orientation or measurement operations, in some embodiments of the present technology.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers and wet clean system may be configured to perform one or more process operations in the fabrication of a semiconductor structure. More specifically, the processing chambers may be outfitted to perform a number of additional substrate processing operations that may include dry etch processes, cyclical layer deposition, atomic layer deposition, chemical vapor deposition, physical vapor deposition, etch, pre-clean, degas, orientation, among any number of other substrate processes.

Figure 2:
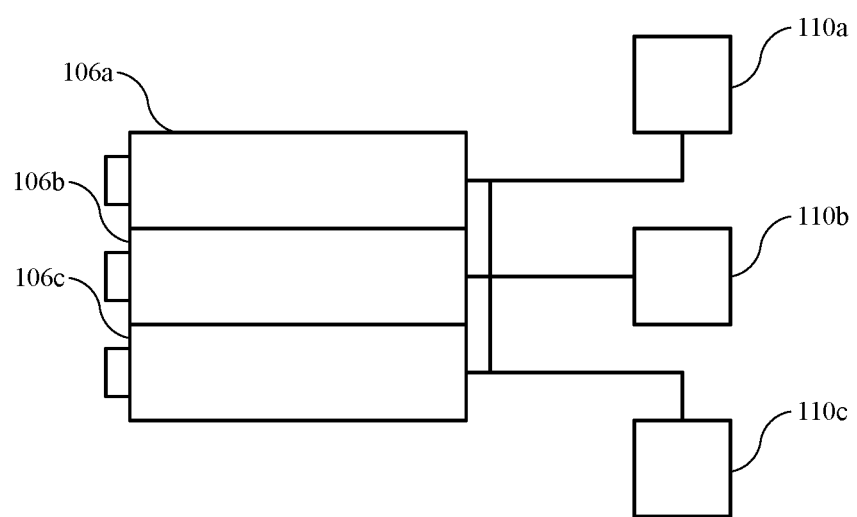
FIG. 2 shows a schematic cross-sectional view of stacked wet clean chambers according to some embodiments of the present technology.

As explained previously, wet clean chamber 106 may include multiple single-wafer wet clean chambers in some embodiments of the present technology. FIG. 2 shows a schematic cross-sectional view of stacked wet clean chambers according to some embodiments of the present technology. As illustrated, two or more wet clean chambers 106 may be stacked vertically, which may limit the length of the integrated cluster tool in some embodiments of the present technology. The chambers may be stacked on one another, and may be accessible to any of the transfer robots. Additionally, because wet clean chambers may be accessed at an angle, as opposed to only by straight-on delivery, the chambers may readily be accessed by the different transfer robots as previously described, without requiring additional modification of the transfer robots.

As explained previously, processing according to some embodiments of the present technology may include performing multiple wet clean operations, which may facilitate removal of a number of impurities on surfaces of the substrate on which epitaxial growth may be performed. In some embodiments, different wet clean chambers may be utilized to perform different cleaning operations. For example, wet clean chamber 106a, may be coupled with chemistry delivery system 110a, which may include chemistry for performing a first wet clean, wet clean chamber 106b, may be coupled with chemistry delivery system 110b, which may include chemistry for performing a second wet clean, and wet clean chamber 106c, may be coupled with chemistry delivery system 110c, which may include chemistry for performing a third wet clean. Additionally, as illustrated, each wet clean chamber 106 may be fluidly coupled with each of the chemistry delivery systems 110, which may allow each wet clean chamber to perform a number of cleaning operations as will be described below. Although three stacked wet clean chambers 106 are illustrated, it is to be understood that in embodiments of the present technology wet clean systems may include a single wet clean chamber, or may include stacked or otherwise oriented clean chambers, including two or more, such as three, four, five, or more wet clean chambers according to embodiments of the present technology.

Figure 3:
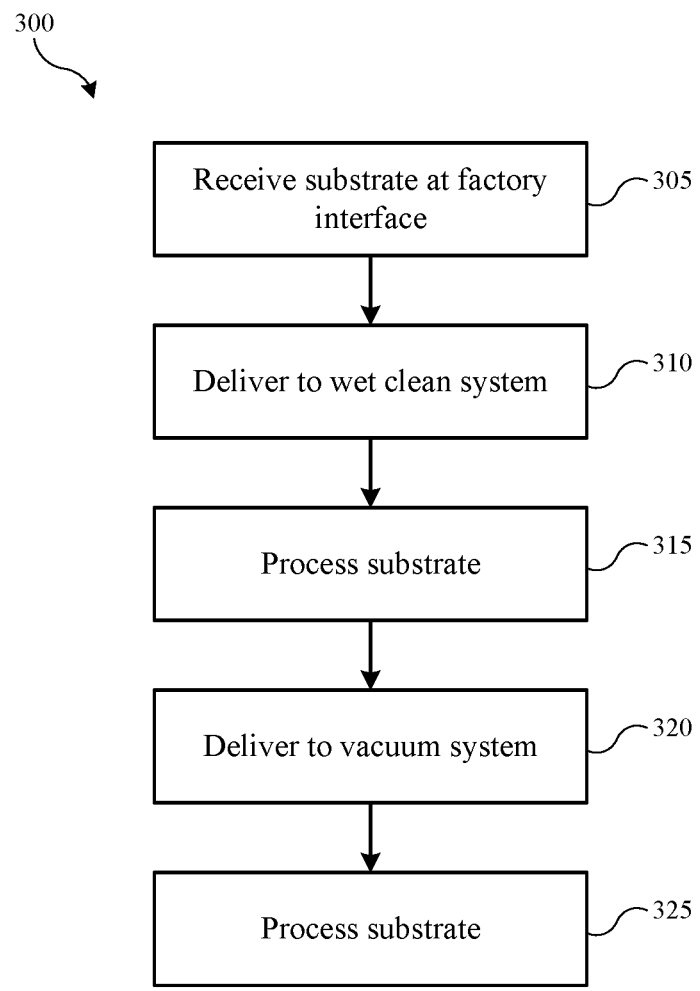
FIG. 3 shows selected operations in a method of processing a substrate according to some embodiments of the present technology.

Turning to FIG. 3 is illustrated selected operations in a method 300 of processing a substrate according to some embodiments of the present technology. Method 300 may include one or more operations prior to the initiation of the method, including front end processing, deposition, etching, polishing, cleaning, or any other operations that may be performed prior to the described operations. For example, in some embodiments a semiconductor structure may be developed on which epitaxial growth, including selective epitaxial growth, may be performed. As one non-limiting example, a FinFET gate structure may be developed to a point where source/drain epitaxial growth may be performed. Any number of other structures may similarly be produced to a point where pre-epitaxy cleaning and/or epitaxial growth may be desired, such as on silicon or silicon-containing materials. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below.

Method 300 may involve receiving a substrate at a factory interface of an integrated cluster tool at operation 305, such as integrated multi-chamber processing system 100 described above. The substrate may be removed from a FOUP by a transfer robot into the tool environment. At operation 310, the substrate may be delivered from the factory interface to a wet clean system, which may be maintained at a higher processing pressure, such as up to atmospheric pressure. Substrate processing may be performed at operation 315 with one or more wet clean chambers as will be described further below. Once the substrate cleaning operations have completed, the substrate may be delivered to a vacuum system at operation 320. For example, a transfer robot that may remove the substrate from the wet clean chamber may directly load the substrate into a load lock chamber connected with the wet clean system, as previously described. From the load lock chamber, the substrate may be further processed at operation 325. For example, in some embodiments a dry etch process may be performed, which may include a plasma etching process, for example. Additionally, processing may include delivering the substrate to one or more epitaxial growth chambers, where one or more epitaxial growth operations may be performed.

Epitaxial growth processes may include any number of processes to develop structures on a semiconductor substrate, and may include selective epitaxial growth. As one non-limiting example of deposition that may be performed according to embodiments of the present technology, a first epitaxial deposition may be performed on the cleaned substrate surfaces, such as depositing a first doped silicon material using a low pressure epitaxial growth. The substrate may be transferred to a second epitaxial growth chamber where a second doped silicon material may be formed, such as utilizing a different dopant than the first process. Additionally, an epitaxial process that may be performed may include producing a silicide layer that is formed selectively on portions of the substrate that have been previously cleaned. It is to be understood that any number of epitaxial growth operations may be performed in embodiments encompassed by the present technology.

By delivering the substrate directly to a load lock chamber, time between finishing the wet clean process and starting the epitaxial growth process may be reduced from hours of delay in conventional system, to less than or about 30 minutes, and depending on any intervening processing being performed, the time may be less than or about 20 minutes, less than or about 15 minutes, less than or about 10 minutes, less than or about 5 minutes, or less. Additionally, unlike hours of atmospheric exposure that may occur in conventional technologies, the time between finishing the wet clean operation and delivering the substrate to the load lock chamber may be less than or about 5 minutes, less than or about 3 minutes, less than or about 1 minute, less than or about 50 seconds, less than or about 40 seconds, less than or about 30 seconds, less than or about 20 seconds, less than or about 10 seconds, less than or about 5 seconds, or less. As previously explained, conventional technology with separate tooling for wet cleaning and epitaxy is incapable of producing such uniformity in wafer processing, as substrates wait hours to be transferred between the systems due to batch processing and tool queue times. Consequently, conventional technology requires additional baking operations or additional processing. The present technology, however, may produce a sufficient interface with wet cleaning, and the substrate at all times prior to and including during epitaxial formation may be maintained at temperatures below or about 700° C., and may be maintained at temperatures below or about 600° C., temperatures below or about 500° C., temperatures below or about 400° C., temperatures below or about 300° C., temperatures below or about 200° C., temperatures below or about 100° C., or less.

Wet and dry cleaning by conventional processes may be incapable of reducing contaminant levels without sufficient baking temperature, or may produce devices characterized by increased defects based on surface contamination. For example, conventional technology may be incapable of reducing oxygen contamination below or about $3 \times 10^{13}$ at/cm$^2$, and may similarly be incapable of reducing other contaminants below $5 \times 10^{13}$ at/cm$^2$ without a bake occurring above 700° C. The present technology may be capable of reducing oxygen, carbon, fluorine, and chlorine contamination below or about $5 \times 10^{10}$ at/cm$^2$, or below or about $5 \times 10^{9}$ at/cm$^2$, while maintaining the temperature below or about 700° C., or any of the ranges stated above. By performing a multi-clean process, reduction of a number of contaminants may be afforded.

For example, in some embodiments of the present technology, the wet clean performed prior to a dry clean and/or epitaxial growth process may include a number of operations performed in one or more wet clean chambers. For example, a first clean process may include performing a hydrofluoric acid clean for a first period of time. The hydrofluoric acid etch, performed with dilute hydrofluoric acid, may remove residual dielectric materials that may remain on surfaces on which epitaxial growth may be performed. A first rinse process may then be performed, such as using deionized water. A second clean process may include performing a clean with a solution of ammonium hydroxide and hydrogen peroxide for a second period of time. The solution may remove light organic materials and particles from the surface of the substrate, and may also remove surface-adsorbed halogen materials. A second rinse with deionized water may then be performed. A third clean process may include performing a clean with a solution of hydrochloric acid and hydrogen peroxide for a third period of time. The solution may remove residual metal materials from the surface on which epitaxial growth may be performed. A third rinse with deionized water may then be performed.

The time period for any of the clean and/or rinse processes may be less than or about 60 seconds, and may be less than or about 50 seconds, less than or about 40 seconds, less than or about 30 seconds, less than or about 20 seconds, less than or about 10 seconds, or less. After the cleaning operations have been performed, one or more drying operations may be performed. For example, the substrate may be dried in a spin dry process. Additionally, the chamber may perform more involved drying operations. For example, the cleaned wafer to be dried may be horizontally rotated, and a moveable arm containing two fluid delivery nozzles may be brought to the center of the wafer. The leading nozzle may contain deionized water delivered across the wafer, and the trailing nozzle may contain alcohol, or an $N_2$/tensioactive vapor dispense, for example. The arm then may be moved from the center of the wafer to the edge of the spinning wafer, drying the wafer in a way to limit or prevent development of water marks. Additionally, in some embodiments, a surface modification drying operation may be performed, which may cause silylation reactions that dry the surface on which growth is to be performed. As explained above, different operations may be performed in any number of wet clean chambers. In some embodiments, each of the processes may be performed in a single-wafer wet clean chamber, including the drying operation. By performing processes encompassed by the present technology, improved surfaces for epitaxial growth may be afforded. Additionally, based on the significantly reduced time between wet cleaning and introduction to a vacuum environment, the present technology may improve uniformity of processing wafer to wafer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either limit of the range, both limits of the range, or neither limit of the range are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the chamber" includes reference to one or more chambers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An integrated cluster tool comprising:
a factory interface including a first transfer robot;
a wet clean system coupled with the factory interface at a first side of the wet clean system, the wet clean system comprising a plurality of single-wafer wet clean chambers stacked on one another, wherein each single-wafer wet clean chamber is fluidly coupled with multiple wet chemistry delivery systems;
a load lock chamber coupled with the wet clean system at a second side of the wet clean system opposite the first side of the wet clean system;
a first transfer chamber coupled with the load lock chamber, wherein the first transfer chamber includes a second transfer robot;
a dry etch chamber coupled with the first transfer chamber;
a second transfer chamber coupled with the first transfer chamber, wherein the second transfer chamber includes a third transfer robot; and
an epitaxial growth chamber coupled with the second transfer chamber.

2. The integrated cluster tool of claim 1, wherein the wet clean system comprises:
a single-wafer wet clean chamber operably maintained at atmospheric pressure, wherein the first transfer chamber is maintained at vacuum conditions.

3. The integrated cluster tool of claim 2, wherein the single-wafer wet clean chamber is fluidly coupled with multiple chemistry delivery systems.

4. The integrated cluster tool of claim 2, wherein the single-wafer wet clean chamber is accessible to the first transfer robot of the factory interface.

5. The integrated cluster tool of claim 2, wherein the wet clean system further comprises:
a fourth transfer robot disposed in the wet clean system, wherein the fourth transfer robot is operable to transfer substrates between the single-wafer wet clean chamber and the load lock chamber.

6. The integrated cluster tool of claim 1, wherein a track on which the first transfer robot operates extends into the wet clean system.

* * * * *